US00RE50658E

(19) United States
(12) Reissued Patent
Yanagidaira et al.

(10) Patent Number: US RE50,658 E
(45) Date of Reissued Patent: *Nov. 4, 2025

(54) SEMICONDUCTOR DEVICE

(71) Applicant: Kioxia Corporation, Tokyo (JP)

(72) Inventors: Kosuke Yanagidaira, Fujisawa (JP); Kazuhide Yoneya, Sagamihara (JP)

(73) Assignee: Kioxia Corporation, Tokyo (JP)

( * ) Notice: This patent is subject to a terminal disclaimer.

(21) Appl. No.: 17/855,226

(22) Filed: Jun. 30, 2022

Related U.S. Patent Documents

Reissue of:
(64) Patent No.: 10,043,905
Issued: Aug. 7, 2018
Appl. No.: 15/000,519
Filed: Jan. 19, 2016

U.S. Applications:
(63) Continuation of application No. 16/842,237, filed on Apr. 7, 2020, now Pat. No. Re. 49,164, which is an application for the reissue of Pat. No. 10,043,905.
(Continued)

(51) Int. Cl.
*H10D 84/85* (2025.01)
*H10D 30/69* (2025.01)
(Continued)

(52) U.S. Cl.
CPC ..... *H10D 84/853* (2025.01); *H10D 30/795* (2025.01); *H10D 30/797* (2025.01);
(Continued)

(58) Field of Classification Search
CPC ..... H01L 27/092; H01L 29/7848; H01L 29/0653; H01L 27/0207; H01L 29/7846;
(Continued)

(56) References Cited

U.S. PATENT DOCUMENTS 5,268,319 A * 12/1993 Harari ..... G11C 11/5621 257/320
5,976,927 A * 11/1999 Hsieh ..... H01L 21/76202 257/E21.552
(Continued)

FOREIGN PATENT DOCUMENTS

JP 2001-185721 7/2001
JP 2006-286889 10/2006
(Continued)

OTHER PUBLICATIONS

H. Irie et al "In-Plane Mobility Anisotropy and University Under Uni-Axial Strains in N- and P-MOS Inversion Layers on (100), (110), and (111) Si", IEDM Tech. Dig. 2004, 4 pages.
(Continued)

*Primary Examiner* — Minh Nguyen
(74) *Attorney, Agent, or Firm* — Oblon, McClelland, Maier & Neustadt, L.L.P.

(57) ABSTRACT

According to one embodiment, a semiconductor device includes a first element isolating area, a first element area surrounding the first element isolating area, a second element isolating area surrounding the first element area a first gate electrode provided on and across the first element isolating area, the first element area, and the second element isolating area, and a second gate electrode isolated from the first gate electrode and provided on and across the first element isolating area, the first element area, and the second element isolating area.

11 Claims, 12 Drawing Sheets

Related U.S. Application Data

(60) Provisional application No. 62/217,357, filed on Sep. 11, 2015.

(51) Int. Cl.
*H10D 62/10* (2025.01)
*H10D 84/01* (2025.01)
*H10D 84/03* (2025.01)
*H10D 89/10* (2025.01)

(52) U.S. Cl.
CPC ..... *H10D 62/116* (2025.01); *H10D 62/126* (2025.01); *H10D 84/85* (2025.01); *H10D 89/10* (2025.01); *H10D 84/0167* (2025.01); *H10D 84/0188* (2025.01); *H10D 84/038* (2025.01)

(58) Field of Classification Search
CPC ..... H01L 29/0692; H01L 27/0924; H01L 21/823807; H01L 21/823878
See application file for complete search history.

(56) References Cited

U.S. PATENT DOCUMENTS 7,067,895 B1* 6/2006 Razouk ..... H01L 27/14632 257/461
7,679,106 B2 3/2010 Hamada
7,821,077 B2 10/2010 Tamura
2001/0005022 A1 6/2001 Ogura
2003/0127752 A1* 7/2003 Kim ..... H01L 27/1104 257/213
2005/0079668 A1* 4/2005 Jung ..... H01L 21/823892 438/210
2006/0077732 A1* 4/2006 Hojo ..... G06F 11/1008 365/200
2006/0145266 A1* 7/2006 Zushi ..... H01L 27/0207 257/369
2006/0220142 A1 10/2006 Tamura
2007/0241323 A1* 10/2007 Saenger ..... H01L 21/823807 257/50
2008/0061350 A1* 3/2008 Watanabe ..... H01L 21/28273 257/315
2008/0093673 A1* 4/2008 Tamura ..... H01L 29/7843 257/365
2008/0237749 A1* 10/2008 Zhu ..... H01L 21/28044 257/412
2008/0251842 A1* 10/2008 Sudo ..... H01L 21/823807 257/347
2008/0283871 A1 11/2008 Hamada
2009/0152734 A1* 6/2009 Smayling ..... H01L 29/42376 257/774
2009/0212854 A1* 8/2009 Baumgartner ..... H01L 29/4238 327/543
2010/0176457 A1* 7/2010 Jin ..... H01L 29/7843 257/369
2011/0165746 A1* 7/2011 Liu ..... H01L 21/28273 438/264
2011/0193152 A1* 8/2011 Kutsukake ..... H01L 27/115 257/316
2012/0146149 A1* 6/2012 Momiyama ..... H01L 21/823878 257/351
2012/0261760 A1* 10/2012 Haneda ..... H01L 21/76229 257/368
2013/0149835 A1* 6/2013 Son ..... H01L 29/401 438/400
2015/0357365 A1* 12/2015 Kimura ..... H01L 27/14607 257/225
2016/0064447 A1* 3/2016 Kimura ..... H01L 27/14643 257/292
2016/0284759 A1* 9/2016 Kimura ..... H01L 27/14643
2017/0062500 A1* 3/2017 Kimura ..... H01L 27/14605

FOREIGN PATENT DOCUMENTS

JP 2008-218899 9/2008
JP 2008-288268 11/2008
JP 2009-295890 12/2009
WO WO 2009/037808 A1 3/2009

OTHER PUBLICATIONS

Scott E. Thompson et al. "A 90-nm Logic Technology Featuri8ng Strained-Silicon", IEEE Transactions on Electron Devices, vol. 51, No. 11, 2004, 8 pages.
T. Komoda et al. "Mobility Improvement for 45nm Node by Combination of Optimized Stress Control and Channel Orientation Design", IEDM Tech. Dig. 2004, 4 pages.
H. Sayama et al "Effect of <100> Channel Direction for High Performance SCE Immune pMOSFET with Less Than 0.15μm Gate Length", IEDM Tech. Dig. 1999, 4 pages.

* cited by examiner

SEMICONDUCTOR DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATIONS

[This application] *More than one reissue application has been filed for the reissue of U.S. Pat. No. 10,043,905. These applications are the present application and U.S. application Ser. No. 16/842,237 filed Apr. 7, 2020, now Reissue Pat. No. RE49,164. The present application is a continuation reissue application of U.S. application Ser. No. 16/842,237, which is a Reissue of U.S. Pat. No. 10,043,905, issued Aug. 7, 2018, which* is based upon and claims the benefit of priority from U.S. Provisional Application No. 62/217,357, filed Sep. 11, 2015, the entire contents of all of which are incorporated herein by reference.

FIELD

The present embodiments relate to a semiconductor device.

BACKGROUND

As a technique to improve MOSFET current drivability, a method for applying distortion (stress) to a semiconductor substrate has been proposed. As stress applied to the semiconductor substrate, stress applied from STI (Shallow Trench Isolation) to an active area is known.

DETAILED DESCRIPTION

Figure 1:
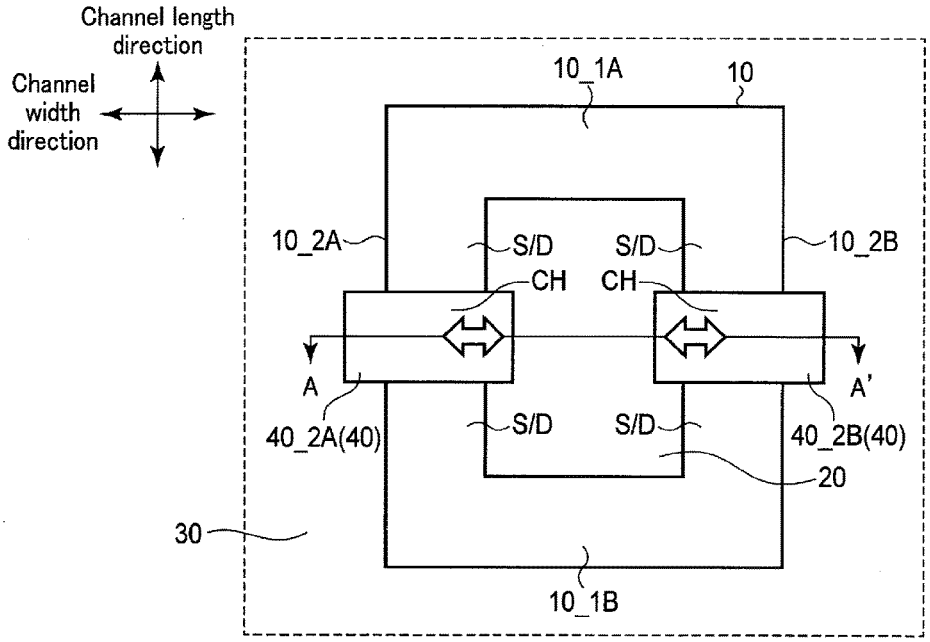
FIG. 1 is a layout diagram of a semiconductor device according to a first embodiment.

In general, according to one embodiment, a semiconductor device includes a first element isolating area, a first element area surrounding the first element isolating area, a second element isolating area surrounding the first element area a first gate electrode provided on and across the first element isolating area, the first element area, and the second element isolating area, and a second gate electrode isolated from the first gate electrode and provided on and across the first element isolating area, the first element area, and the second element isolating area.

Hereinafter, the present embodiments will be described with reference to the drawings. In the drawings, identical portions will be applied identical reference symbols.

First Embodiment

In the following, a semiconductor device according to a first embodiment will be explained with reference to FIG. 1 to FIG. 3.

In the first embodiment, an annular active area 10 is provided in a manner surrounding an element isolating area 20. By forming a MOS transistor on this active area 10, a significant stress can be applied on a channel CH of the MOS transistor, thereby, improving mobility of an electric charge in the MOS transistor.

The first embodiment is explained in detail below.

Configuration Example in First Embodiment

FIG. 1 is a layout diagram of the semiconductor device according to the first embodiment. FIG. 2 is a cross-sectional view taken along A-A' of FIG. 1.

Figure 2:
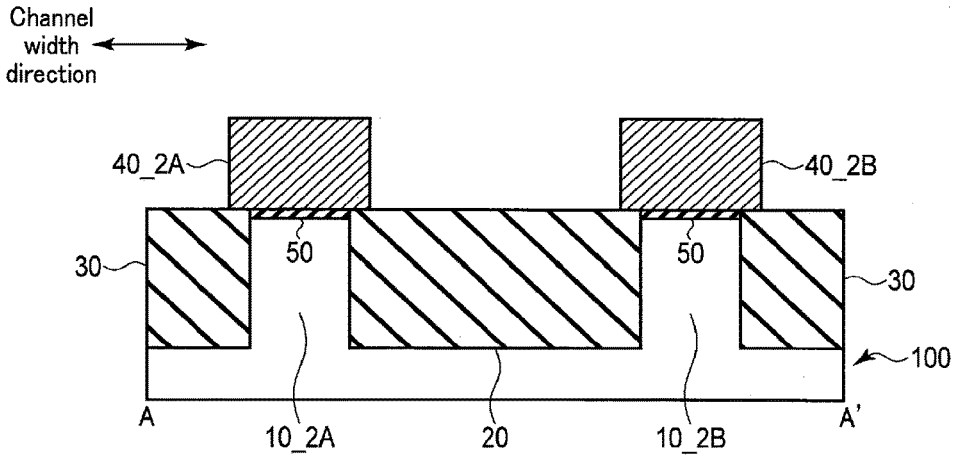
FIG. 2 is a cross-sectional view taken along A-A' of FIG. 1.

As shown in FIG. 1 and FIG. 2, the semiconductor device includes an active area (element area) 10, element isolating areas 20 and 30, and a gate electrode 40 (40_2A, 40_2B).

The element isolating area 20 is an STI provided in a semiconductor substrate (Si substrate) 100. The element isolating area 20 includes, for example, $SiO_2$. The circumference (four sides) of the element isolating area 20 is surrounded by the active area 10.

The active area 10 is provided on a surface of the semiconductor substrate 100 in a manner which surrounds the circumference of the element isolating area 20. More specifically, the active area 10 includes regions 10_1A, 10_1B, 10_2A, and 10_2B. Regions 10_1A and 10_1B extend in a channel width direction (horizontal direction of the drawing), and regions 10_2A and 10_2B extend in a channel length direction (vertical direction of the drawing). Region 10_2A connects one end portion of region 10_1A and one end portion of region 10_1B, and region 10_2B connects the other end portion of region 10_1A and the other end portion of region 10_1B. In other words, regions 10_1A, 10_1B, 10_2A, and 10_2B form a rectangular annular shape.

The element isolating area 30 is provided in a manner surrounding the active area 10. The element isolating area 30 is isolated from the element isolating area 20.

The gate electrode 40_2A is provided on and across the element isolating area 30, the active area 10 (region 10_2A), and the element isolating area 20. The gate electrode 40_2A is orthogonal to the region 10_2A. A gate insulation film 50 is provided between the gate electrode 40_2A and the active area 10. In this manner, a channel CH is formed on the active area 10 under the gate electrode 40_2A. A source/drain S/D is provided on the active area 10 so as to sandwich this channel CH. In this manner, the gate electrode 40_2A and the active area 10 form a MOS transistor.

The gate electrode 40_2B is provided on and across the element isolating area 30, the active area 10 (region 10_2B), and the element isolating area 20. The gate electrode 40_2B is orthogonal to the region 10_2B. The gate electrode 40_2B is isolated from the gate electrode 40_2A. The gate insulation film 50 is provided between the gate electrode 40_2A and the active area 10. In this manner, the channel is formed on the active area 10 under the gate electrode 40_2B. The source/drain S/D is provided on the active area 10 so as to sandwich this channel. In this manner, the gate electrode 40_2B and the active area 10 form a MOS transistor.

In this manner, the active area 10 is in contact with the element isolating area 20. This causes stress to be applied from the element isolating area 20 to the active area 10. This stress is applied in a vertical direction with respect to a contact surface between the active area 10 and the element isolating area 20. In other words, stress is applied to the channel CH in the channel width direction. In the present example, the circumference of the element isolating area 20 is surrounded (closed) by the active area 10. Therefore, in comparison to the case in which the element isolating area 20 is opened, greater stress is applied to the active area 10. In the case where the element isolating area 20 includes an expandable material, compressive stress is applied to the active area 10. In the case where the element isolating area 20 includes a contractible material, tensile stress is applied to the active area 10.

Although unillustrated, stress is also applied from the element isolating area 30 to the active area 10 in the channel width direction and the channel length direction.

Effect in First Embodiment

According to the first embodiment, the annular active area 10 is provided in a manner surrounding the element isolating area 20. By closing the circumference of the element isolating area 20 by the annular active area 10, the stress from the element isolating area 20 to the active area 10 becomes greater. The gate electrode 40 is provided on this active area 10 to form the MOS transistor. In this manner, significant stress may be applied to the channel CH of the MOS transistor, thereby, improving the mobility of an electric charge in the MOS transistor.

In the first embodiment, the gate electrode 40_2A is provided on region 10_2A, and the gate electrode 40_2B is provided on region 10_2B of the active area 10. The gate electrode 40_2A is orthogonal to the region 10_2A, and the gate electrode 40_2B is orthogonal to the region 10_2B. The gate electrode 40_2A and the gate electrode 40_2B are provided in an isolated manner from each other, each forming the MOS transistor. In other words, the gate of the MOS transistor is divided into a plurality of nodes. In this manner, a complicated circuit with excellent electric properties may be realized.

Region 10_2A and region 10_2B are provided symmetrically. In this manner, the stress from the element isolating area 20 to region 10_2A and region 10_2B becomes equal. Therefore, the MOS transistor formed by the gate electrode 40_2A and the gate electrode 40_2B may have identical properties.

In the case where the active area 10 has a rectangular shape with a hollow space (STI) in its center as shown in FIG. 1, strong stress is applied to corners of the active area 10 in the vertical and horizontal directions. Therefore, there is concern that crystal defects may occur. Crystal defects may lead to an increase in junction leakage and a deterioration in transistor properties. As a countermeasure, it is desirable to set the channel surface to (100) plane and the channel length direction to <100> direction in the MOS transistor. Generally, the widely-used <110> direction is more susceptible to defects than the <100> direction in terms of crystal construction. Using the <100> direction, makes it difficult for defects to occur, thereby reducing junction leakage. Furthermore, the <100> direction is more capable of improving current drivability of the transistor than the <110> direction.

Modified Example in First Embodiment

Figure 3:
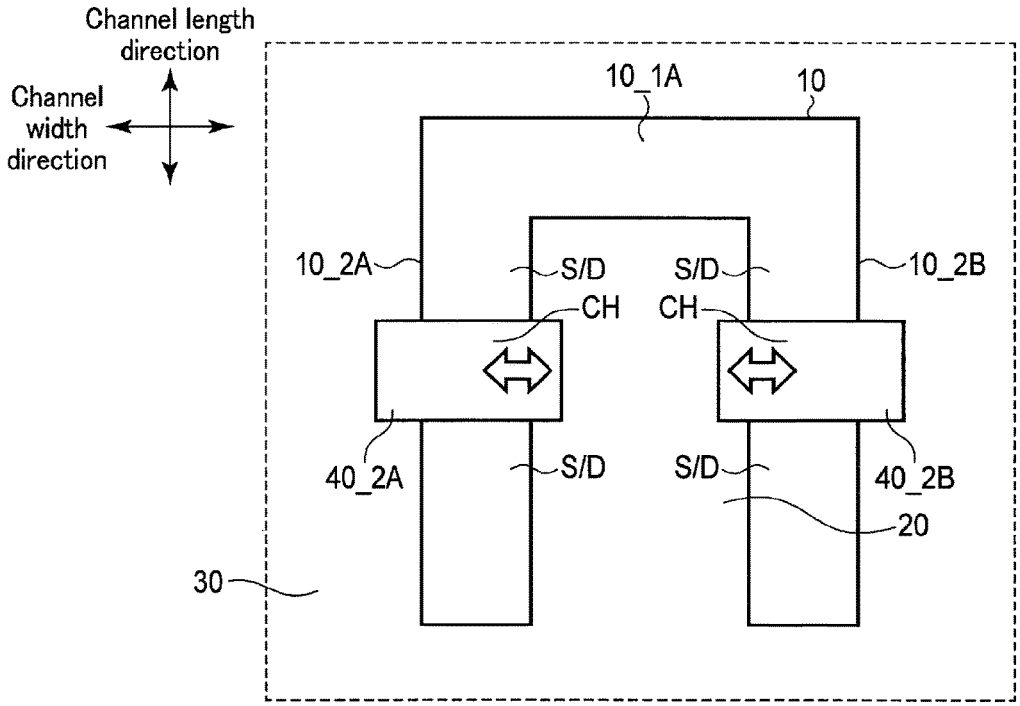
FIG. 3 is a layout diagram of a modified example of the semiconductor device according to the first embodiment.

FIG. 3 is a layout diagram of a modified example of the semiconductor device according to the first embodiment.

As shown in FIG. 3, according to the modified example, the three sides of the element isolating area 20 are surrounded by the active area 10. The active area 10 includes regions 10_1A, 10_2A, and 20_2B, and surrounds the three sides of the element isolating area 20. In other words, the element isolating area 20 is opened at one side and is connected to the element isolating area 30.

In this manner, the active area 10 is in contact with the element isolating area 20. In the present example, the three sides of the element isolating area 20 are surrounded by the active area 10. Therefore, in comparison to the case in which the circumference of the element isolating area 20 is opened, greater stress is applied to the active area 10.

Second Embodiment

In the following, a semiconductor device according to a second embodiment will be explained with reference to FIG. 4.

The second embodiment is an application example of the first embodiment, in which an annular active area 10 is provided in a manner surrounding a plurality of element isolating areas 20A to 20C aligned in a channel width direction. In this manner, significant stress may be applied to both sides of regions 10_2B and 10_2C, thereby, improving the mobility of an electric charge in a MOS transistor.

The second embodiment is explained in detail below. In the second embodiment, explanations on the matters which are the same as in the first embodiment are omitted, and mainly those matters which are different are explained.

Configuration Example in Second Embodiment

Figure 4:
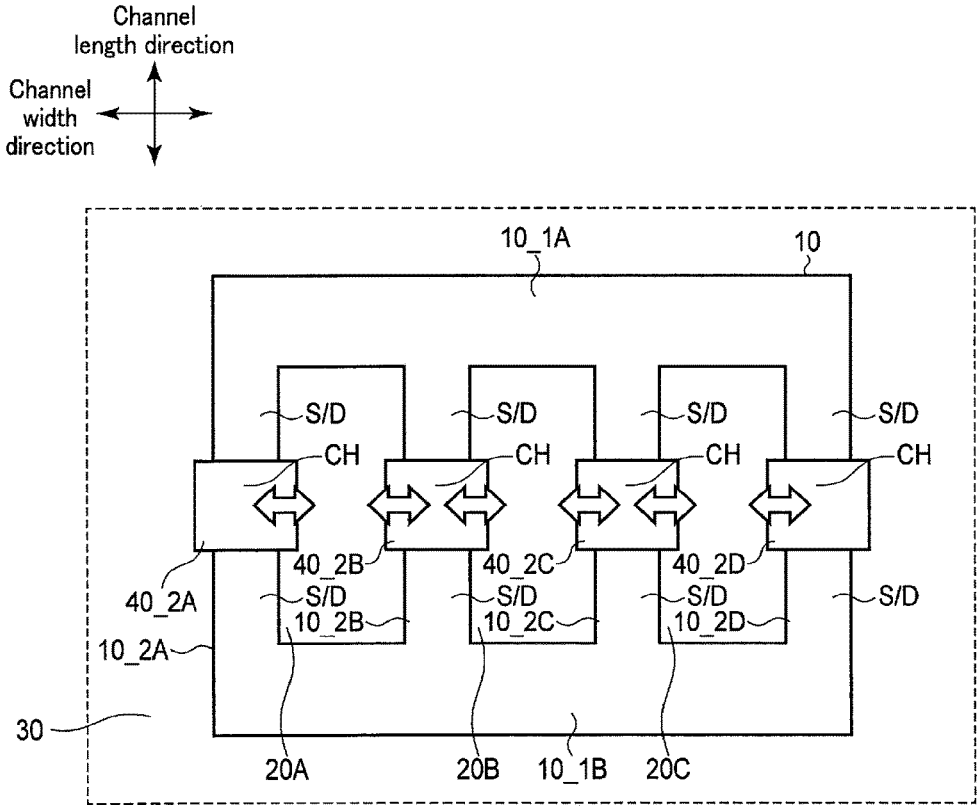
FIG. 4 is a layout diagram of a semiconductor device according to a second embodiment.

FIG. 4 is a layout diagram of the semiconductor device according to the second embodiment.

As shown in FIG. 4, the semiconductor device includes an active area 10, element isolating areas 20A, 20B, 20C, and 30, and a gate electrode 40 (40_2A, 40_2B, 40_2C, 40_2D).

The circumference (four sides) of the element isolating areas 20A, 20B, and 20C is surrounded by the active area 10. The element isolating areas 20A, 20B, and 20C are aligned along the channel width direction. The element isolating areas 20A, 20B, and 20C are isolated from each other.

The active area 10 is provided in a manner surrounding the element isolating areas 20A, 20B, and 20C. More specifically, the active area 10 includes regions 10_1A, 10_1A, 10_1B, 10_2A, 10_2B, 10_2C, and 10_2D. Regions 10_1A and 10_1B extend in a channel width direction (horizontal direction of the drawing), and regions 10_2A, 10_2B, 10_2C, and 10_2D extend in a channel length direction (vertical direction of the drawing). Regions 10_2A, 10_2B, 10_2C, and 10_2D are aligned along the channel width direction. Region 10_2A connects one end portion of region 10_1A and one end portion of region 10_1B. Regions [10_23] *10_2B* and 10_2C connect a part of region 10_1A and a part of region 10_1B. Region 10_2D connects the other end portion of region 10_1A and the other end portion of region 10_1B. In other words, regions 10_1A, 10_1B, 10_2A, 10_2B, 10_2C, and 10_2D form a ladder shape.

The element isolating area 20A is surrounded by regions 10_1A, 10_1B, 10_2A, and 10_2B, the element isolating area 20B is surrounded by regions 10_1A, 10_1B, 10_2B, and 10_2C, and the element isolating area 20C is surrounded by regions 10_1A, 10_1B, 10_2C, and 10_2D.

The element isolating area 30 is provided in a manner surrounding the active area 10. The element isolating area 30 is isolated from the element isolating areas 20A, 20B, and 20C.

The gate electrode 40_2A is provided on and across the element isolating area 30, the active area 10_2A, and the element isolating area 20A. The gate electrode 40_2A is orthogonal to the region 10_2A. In this manner, the channel CH is formed on the active area 10 under the gate electrode 40_2A. A source/drain S/D is provided on the active area 10 so as to sandwich this channel CH. In this manner, the gate electrode 40_2A and the active area 10 form the MOS transistor.

The gate electrode 40_2B is provided on and across the element isolating area 20A, the active area 10_2B, and the element isolating area 20B. The gate electrode 40_2B is orthogonal to the region 10_2B. In this manner, the channel CH is formed on the active area 10 under the gate electrode 40_2B. A source/drain S/D is provided on the active area 10 so as to sandwich this channel CH. In this manner, the gate electrode 40_2B and the active area 10 form the MOS transistor.

The gate electrode 40_2C is provided on and across the element isolating area 20B, the active area 10_2C, and the element isolating area 20C. The gate electrode 40_2C is orthogonal to the region 10_2C. In this manner, the channel CH is formed on the active area 10 under the gate electrode 40_2C. A source/drain S/D is provided on the active area 10 so as to sandwich this channel CH. In this manner, the gate electrode 40_2C and the active area 10 form the MOS transistor.

The gate electrode 40_2D is provided on and across the element isolating area 20C, the active area 10_2D, and the element isolating area 30. The gate electrode 40_2D is orthogonal to the region 10_2D. In this manner, the channel CH is formed on the active area 10 under the gate electrode 40_2D. A source/drain S/D is provided on the active area 10 so as to sandwich this channel CH. In this manner, the gate electrode 40_2D and the active area 10 form the MOS transistor.

In the above manner, in the active area 10, region 10_2B is in contact with the element isolating area 20A at one side, and the element isolating area 20B at the other side. The circumference of the element isolating areas 20A and 20B is surrounded (enclosed) by the active area 10. Therefore, significant stress is applied to both sides of region 10_2B by the element isolating areas 20A and 20B. In the same manner, significant stress is applied to both sides of region 10_2C by the element isolating areas 20B and 20C.

Meanwhile, significant stress is applied to one side of region 10_2A by the element isolating area 20A. In the same manner, significant stress is applied on one side of region 10_2D by the element isolating area 20C.

Effect in Second Embodiment

According to the second embodiment, the annular active area 10 is provided in a manner surrounding a plurality of element isolating areas 20A to 20C. In this manner, one of the closed element isolating areas 20A to 20C is arranged on both sides of regions [10_23] *10_2B* and 10_2C in the active area 10. In this manner, significant stress can be applied to both sides of regions 10_2B and 10_2C. Therefore, greater stress can be applied to the channel CH of the MOS transistor than in the case of the first embodiment, thereby improving the mobility of an electric charge in the MOS transistor.

Meanwhile, significant stress is applied to one side of region 10_2A by the element isolating area 20A. In the same manner, significant stress is applied on one side of region 10_2D by the element isolating area 20C. In other words, the applied stress is different between regions 10_2A and 10_2D and regions 10_2B and 10_2C. Therefore, the properties differ between the MOS transistors provided on regions 10_2A and 10_2D and the MOS transistors provided on regions 10_2B and 10_2C. Accordingly, in the case where the difference in the properties of the MOS transistors becomes a problem, the MOS transistors provided on regions 10_2A and 10_2D may be considered as dummy transistors.

Third Embodiment

In the following, a semiconductor device according to a third embodiment will be explained with reference to FIG. 5 to FIG. 7.

In the third embodiment, a gate electrode 40_1A is provided on region 10_1A, and a gate electrode 40_1B is provided on region 10_1B in an active area 10. The gate electrode 40_1A is parallel to region 10_1A, and the gate electrode 40_1B is parallel to region 10_1B. In this manner, significant stress may be applied to a channel CH of an MOS transistor in a channel length direction. By controlling the direction of stress as appropriate in the manner set forth in the present example, electric charge mobility with respect to various MOS transistors may be improved.

The third embodiment is explained in detail below. In the third embodiment, explanations on the matters which are the same as in the first embodiment are omitted, and mainly those matters which are different are explained.

Configuration Example in Third Embodiment

Figure 5:
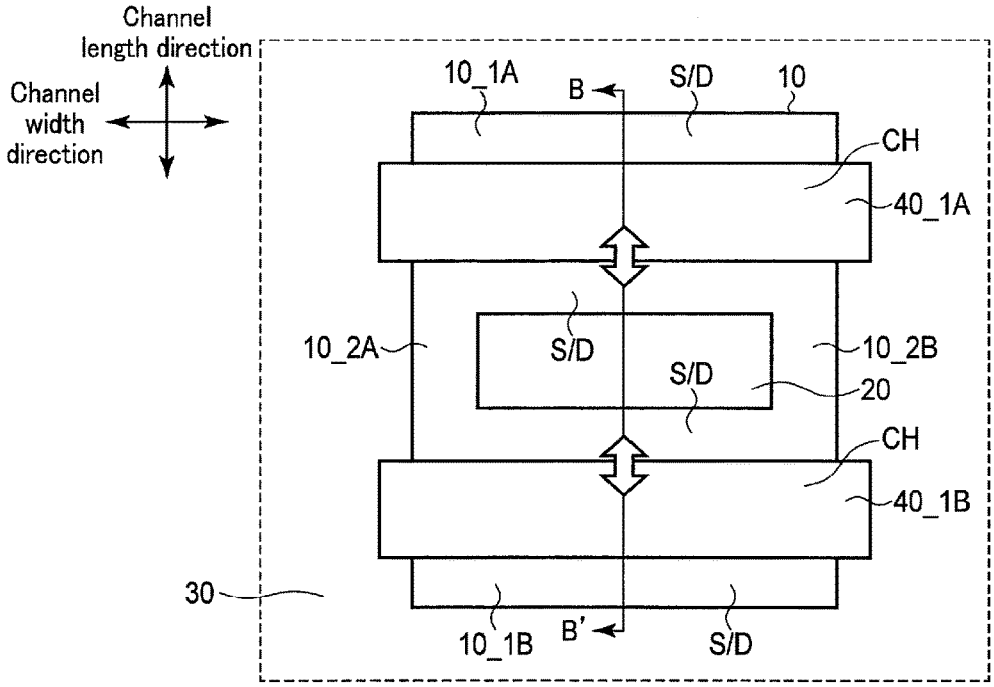
FIG. 5 is a layout diagram of a semiconductor device according to a third embodiment.

FIG. 5 is a layout diagram of the semiconductor device according to the third embodiment. FIG. 6 is a cross-sectional view taken along B-B' of FIG. 5.

Figure 6:
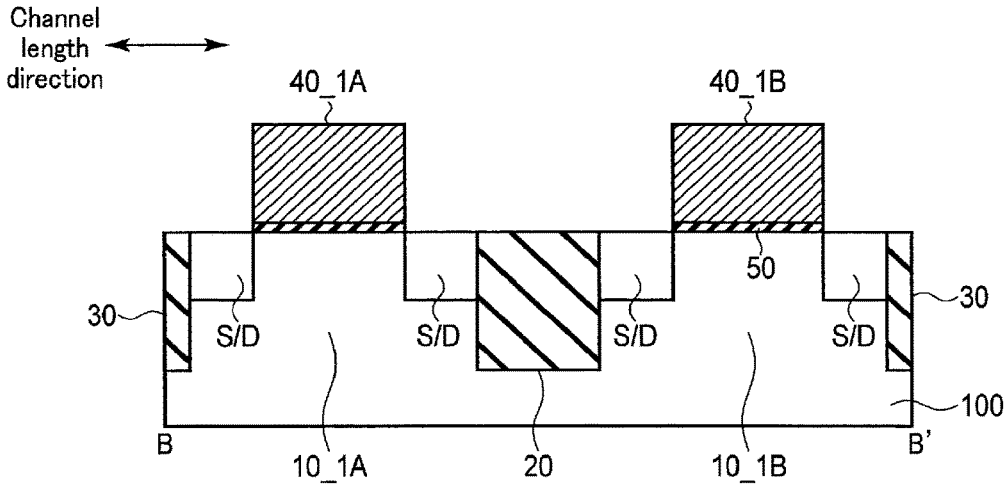
FIG. 6 is a cross-sectional view taken along B-B' of FIG. 5.

As shown in FIG. 5 and FIG. 6, the semiconductor device includes an active area (element area) 10, element isolating areas 20 and 30, and a gate electrode 40 ([40_21A] *40_1A*, 40_1B).

The gate electrode 40_1A is provided on and across the element isolating area 30, the active area 10 (region 10_1A), and the element isolating area 30. The gate electrode 40_1A is parallel to region 10_1A. A gate insulation film 50 is provided between the gate electrode 40_1A and the active area 10. In this manner, the channel CH is formed on the active area 10 under the gate electrode 40_1A. A source/drain S/D is provided on the active area 10 so as to sandwich this channel CH. In this manner, the gate electrode 40_1A and the active area 10 form the MOS transistor.

The gate electrode 40_1B is provided on and across the element isolating area 30, the active area 10 (region 10_1B), and the element isolating area 30. The gate electrode 40_1B is parallel to region 10_1B. The gate insulation film 50 is provided between the gate electrode 40_1B and the active area 10. In this manner, the channel CH is formed on the active area 10 under the gate electrode 40_1B. A source/drain S/D is provided on the active area 10 so as to sandwich this channel CH. In this manner, the gate electrode 40_1B and the active area 10 form the MOS transistor.

In this manner, the active area 10 is in contact with the element isolating area 20. This causes stress to be applied from the element isolating area 20 to the active area 10. This stress is applied in a vertical direction with respect to a contact surface between the active area 10 and the element isolating area 20. In other words, stress is applied in the channel length direction with respect to the channel CH.

Although unillustrated, stress is also applied from the element isolating area 30 to the active area 10 in the channel width direction and the channel length direction.

Effect in Third Embodiment

In the third embodiment, the gate electrode 40_1A is provided on region 10_1A, and the gate electrode 40_1B is provided on region 10_1B in the active area 10. The gate electrode 40_1A is parallel to region 10_1A, and the gate electrode 40_1B is parallel to region 10_1B. In this manner, significant stress can be applied to a channel CH of a MOS transistor in a channel length direction. In other words, stress may be applied in a direction different from that of the first embodiment. In the MOS transistor, the stress direction for improving electric charge mobility is different depending on the condition of, such as, material. By controlling the direction of stress as appropriate in the manner set forth in the present example, electric charge mobility with respect to various MOS transistors can be improved.

Modified Example in Third Embodiment

Figure 7:
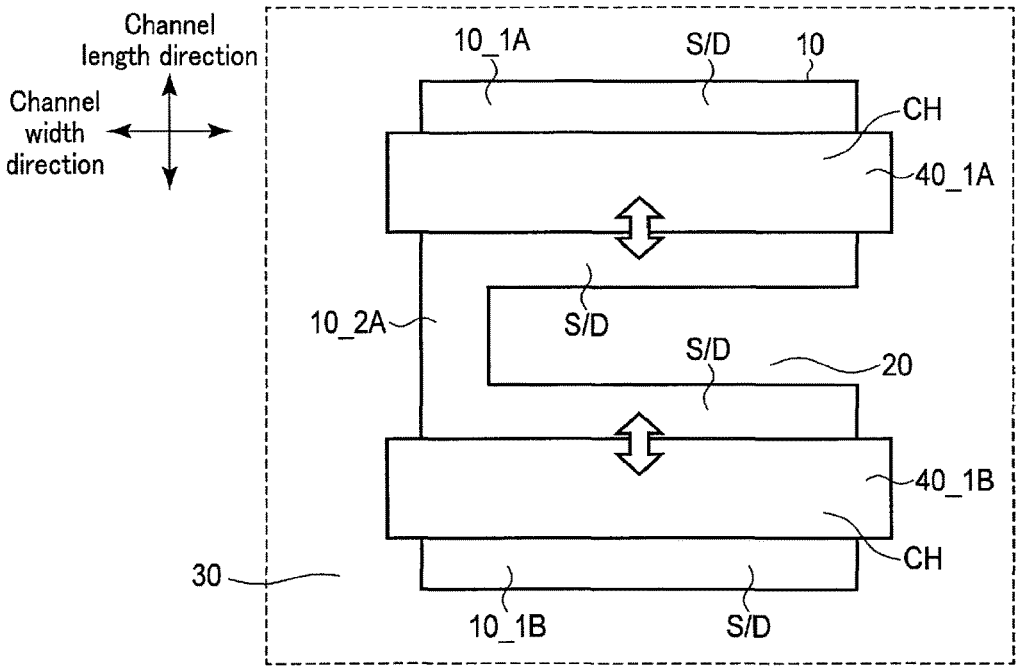
FIG. 7 is a layout diagram of a modified example of the semiconductor device according to the third embodiment.

FIG. 7 is a layout diagram of a modified example of the semiconductor device according to the third embodiment.

As shown in FIG. 7, according to the modified example, the three sides of the element isolating area 20 are surrounded by the active area 10. The active area 10 includes regions 10_1A, 10_1B, and 10_2A, and surrounds the three sides of the element isolating area 20. In other words, the element isolating area 20 is connected to the element isolating area 30 at one side.

In this manner, the active area 10 is in contact with the element isolating area 20. In the present example, the three sides of the element isolating area 20 are surrounded by the active area 10. Therefore, in comparison to the case in which the circumference of the element isolating area 20 is opened, greater stress is applied to the active area 10.

Fourth Embodiment

In the following, a semiconductor device according to a fourth embodiment will be explained with reference to FIG. 8.

The fourth embodiment is an application example of the third embodiment, in which the second embodiment is applied to the third embodiment. In the fourth embodiment, an annular active area 10 is provided in a manner surrounding a plurality of element isolating areas 20D to 20F aligned in a channel length direction. In this manner, significant stress may be applied to both sides of regions 10_1B and 10_1C, thereby improving the mobility of an electric charge in an MOS transistor.

The fourth embodiment is explained in detail below. In the fourth embodiment, explanations on the matters which are the same as in the third embodiment are omitted, and mainly those matters which are different are explained.

Configuration Example in Fourth Embodiment

Figure 8:
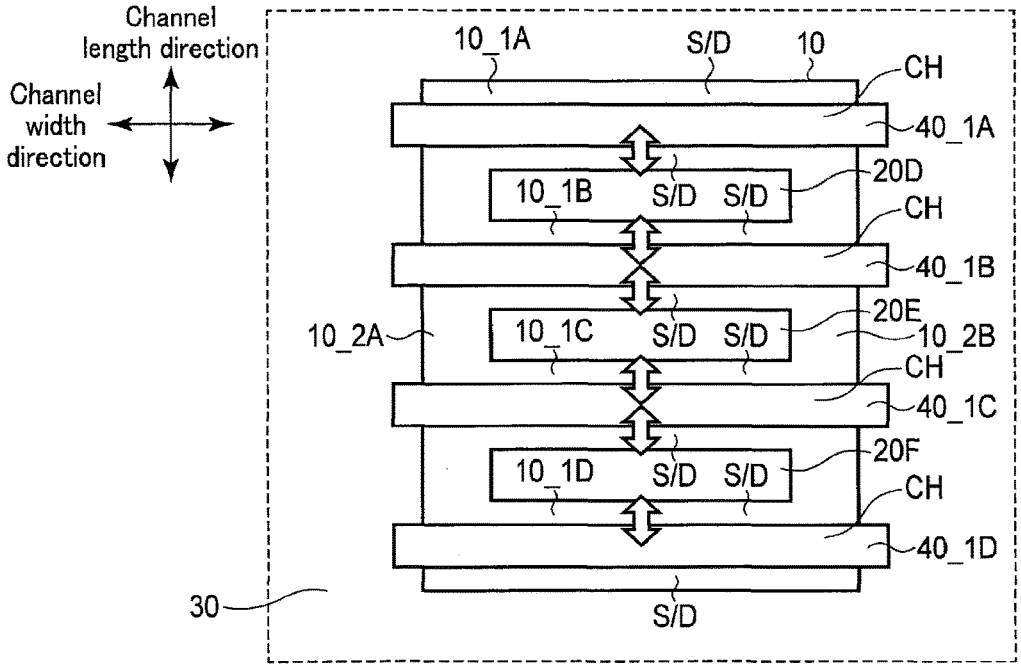
FIG. 8 is a layout diagram of a semiconductor device according to a fourth embodiment.

FIG. 8 is a layout diagram of the semiconductor device according to the fourth embodiment.

As shown in FIG. 8, the semiconductor device includes an active area 10, element isolating areas 20D, 20E, 20F, and 30, and a gate electrode 40 (40_1A, 40_1B, 40_1C, 40_1D).

The circumference (four sides) of the element isolating areas 20D, 20E, and 20F is surrounded by the active area 10. The element isolating areas 20D, 20E, and 20F are aligned along the channel length direction. The element isolating areas 20D, 20E, and 20F are isolated from each other.

The active area 10 is provided in a manner surrounding the element isolating areas 20D, 20E, and 20F. More specifically, the active area 10 includes regions 10_1A, 10_1B, 10_1C, and 10_1D, 10_2A, and 10_2B. Regions 10_1A, 10_1B, 10_1C, and 10_1D extend in a channel width direction (horizontal direction of the drawing), and regions 10_2A and 10_2B extend in the channel length direction (vertical direction of the drawing). Regions 10_1A, 10_1B, 10_1C, and 10_1D are aligned along the channel width direction. Region 10_1A connects one end portion of region 10_2A and one end portion of region 10_2B. Regions 10_1B and 10_1C connect a part of region 10_2A and a part of region 10_2B. Region 10_1D connects the other end portion of region 10_2A and the other end portion of region 10_2B. In other words, regions 10_1A, 10_1B, 10_1C, 10_1D, 10_2A, and 10_2B form a ladder shape.

The element isolating area 20D is surrounded by regions 10_1A, 10_1B, 10_2A, and 10_2B, the element isolating area 20E is surrounded by regions 10_1B, 10_1C, 10_2A, and 10_2B, and the element isolating area 20F is surrounded by regions 10_1C, 10_1D, 10_2A, and 10_2B.

The gate electrode 40_1A is provided on and across the element isolating area 30, the active area 10_2A, and the element isolating area 30. The gate electrode 40_1A is parallel to region 10_1A. In this manner, a channel CH is formed on the active area 10 under the gate electrode 40_1A. A source/drain S/D is provided on the active area 10 so as to sandwich this channel CH. In this manner, the gate electrode 40_1A and the active area 10 form the MOS transistor.

The gate electrode 40_1B is provided on and across the element isolating area 30, the active area 10_1B, and the element isolating area 30. The gate electrode 40_1B is parallel to region 10_1B. In this manner, the channel CH is formed on the active area 10 under the gate electrode 40_1B. A source/drain S/D is provided on the active area 10 so as to sandwich this channel CH. In this manner, the gate electrode 40_1B and the active area 10 form the MOS transistor.

The gate electrode 40_1C is provided on and across the element isolating area 30, the active area 10_1C, and the element isolating area 30. The gate electrode 40_1C is parallel to region 10_1C. In this manner, the channel CH is formed on the active area 10 under the gate electrode 40_1C. A source/drain S/D is provided on the active area 10 so as to sandwich this channel CH. In this manner, the gate electrode 40_1C and the active area 10 form the MOS transistor.

The gate electrode 40_1D is provided on and across the element isolating area 30, the active area 10_1D, and the element isolating area 30. The gate electrode 40_1D is parallel to region 10_1D. In this manner, the channel CH is formed on the active area 10 under the gate electrode 40_1D. A source/drain S/D is provided on the active area 10 so as to sandwich this channel CH. In this manner, the gate electrode 40_1D and the active area 10 form the MOS transistor.

In this manner, in the active area 10, region 10_1B is in contact with the element isolating area 20D at one side, and in contact with the element isolating area 20E at the other side. The circumference of the element isolating areas 20D and 20E is surrounded (closed) by the active area 10. Therefore, significant stress is applied to both sides of region 10_1B by the element isolating areas 20D and 20E. In the same manner, significant stress is applied to both sides of region 10_1C by the element isolating areas 20E and 20F.

Meanwhile, significant stress is applied to one side of region 10_1A by the element isolating area 20D. In the same manner, significant stress is applied to one side of region 10_1D by the element isolating area 20F.

Effect in Fourth Embodiment

In the fourth embodiment, the annular active area 10 is provided in a manner surrounding a plurality of element isolating areas 20D to 20F aligned in the channel length direction. In this manner, one of the closed element isolating areas 20D to 20F is arranged on both sides of regions 10_1B and 10_1C in the active area 10. In this manner, significant stress may be applied to both sides of regions 10_1B and 10_1C. Therefore, greater stress may be applied to the channel CH of the MOS transistor than in the case of the third embodiment, thereby improving the mobility of an electric charge in the MOS transistor.

Meanwhile, significant stress is applied to one side of region 10_1A by the element isolating area 20D. In the same manner, significant stress is applied to one side of region 10_1D by the element isolating area 20F. In other words, the applied stress is different between regions 10_1A and 10_1D and regions 10_1B and 10_1C. Therefore, the properties differ between the MOS transistor provided on regions 10_1A and 10_1D and the MOS transistor provided on regions 10_1B and 10_1C. Accordingly, in the case where the difference in the properties of the MOS transistors become a problem, the MOS transistor provided on regions 10_1A and 10_1D may be considered as a dummy transistor.

Fifth Embodiment

In the following, a semiconductor device according to a fifth embodiment will be explained with reference to FIG. 9.

The fifth embodiment is a combination of the second embodiment and the fourth embodiment. The fifth embodiment is capable of producing the same effects as the second and the fourth embodiments.

The fifth embodiment is explained in detail below. In the fifth embodiment, explanations on the matters which are the same as in the second and the fourth embodiments are omitted, and mainly those matters which are different are explained.

Configuration Example in Fifth Embodiment

Figure 9:
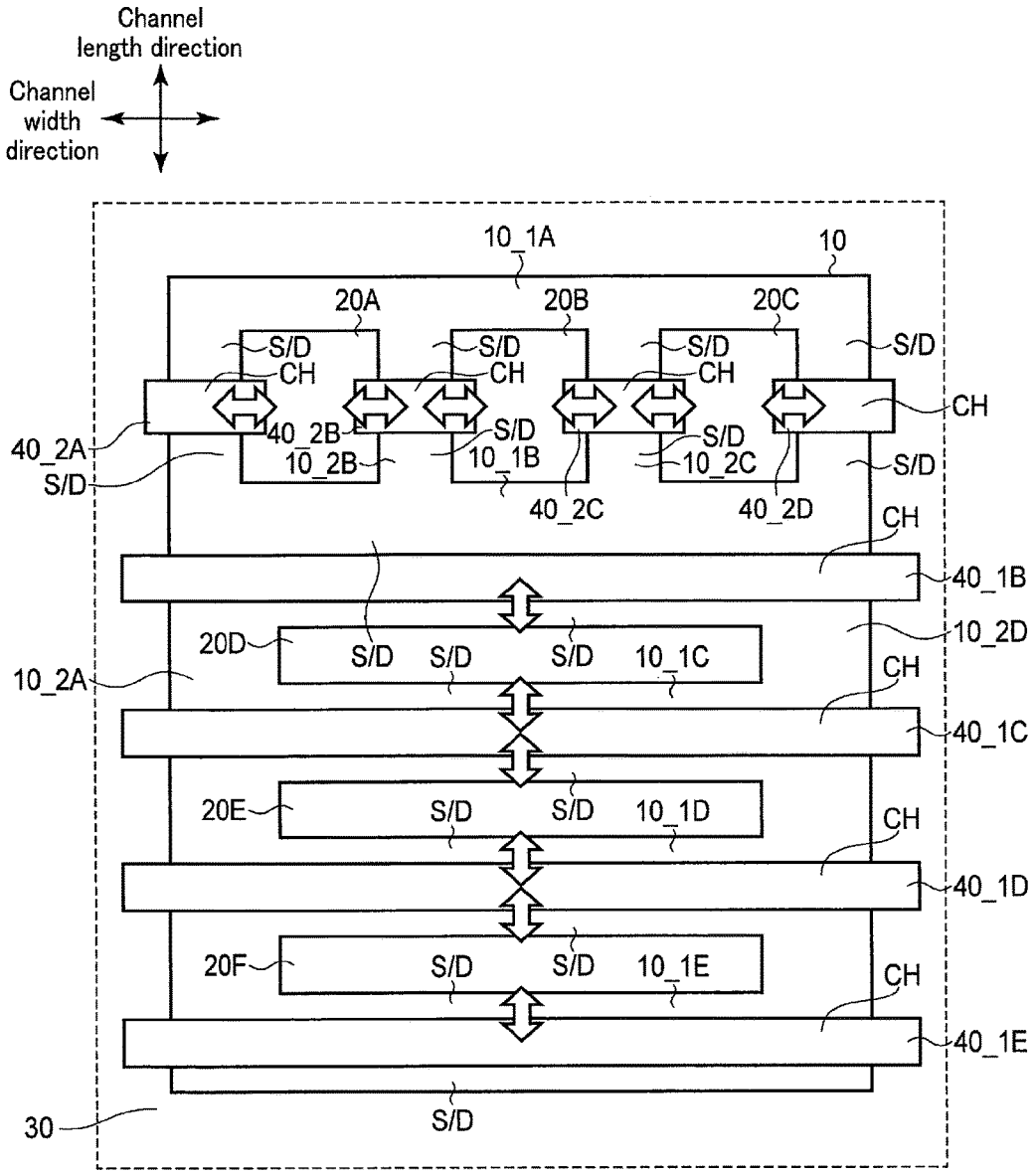
FIG. 9 is a layout diagram of a semiconductor device according to a fifth embodiment.

FIG. 9 is a layout diagram of the semiconductor device according to the fifth embodiment.

As shown in FIG. 9, the semiconductor device includes an active area 10, element isolating areas 20A, 20B, 20C, 20D, 20E, 20F, and 30, and a gate electrode 40 (40_2A, 40_2B, 40_2C, 40_2D, 40_1B, 40_1C, 40_1D, and 40_1E).

The circumference (four sides) of the element isolating areas 20A, 20B, 20C, 20D, 20E, and 20F is surrounded by the active area 10. The element isolating areas 20A, 20B, and 20C are aligned along a channel width direction. The element isolating areas 20D, 20E, and 20F are aligned along a channel length direction. The element isolating areas 20A, 20B, 20C, 20D, 20E, and 20F are isolated from each other.

The active area 10 is provided in a manner surrounding the element isolating areas 20A, 20B, 20C, 20D, 20E, and 20F. More specifically, the active area 10 includes regions 10_1A, 10_1B, 10_1C, 10_1D, 10_1E, 10_2A, 10_2B, 10_2C, and 10_2D. Regions 10_1A, 10_1B, 10_1C, 10_1D, and 10_1E extend in the channel width direction (horizontal direction of the drawing), and regions 10_2A, 10_2B, 10_2C, and 10_2D extend in the channel length direction (vertical direction of the drawing).

Regions 10_1A, 10_1B, 10_1C, 10_1D, and 10_1E are aligned along the channel length direction. Region 10_1A connects one end portion of region 10_2A and one end portion of region 10_2D. Regions 10_1B, 10_1C, and 10_1D connect a part of region 10_2A and a part of region 10_2D. Region 10_1E connects the other end portion of region 10_2A and the other end portion of region 10_2D.

Meanwhile, regions 10_2A, 10_2B, 10_2C, and 10_2D are aligned along the channel width direction. Region 10_2A connects one end portion of region 10_1A and one end portion of region 10_1E. Regions 10_2B and 10_2C connect a part of region 10_1A and a part of region 10_1B. Region 10_2D connects the other end portion of region 10_1A and the other end portion of region 10_1E.

The element isolating area 20A is surrounded by regions 10_1A, 10_1B, 10_2A, and 10_2B, the element isolating area 20B is surrounded by regions 10_1A, 10_1B, 10_2B, and 10_2C, and the element isolating area 20C is surrounded by regions 10_1A, 10_1B, 10_2C, and 10_2D. The element isolating area 20D is surrounded by regions 10_2A, 10_2D, 10_1B, and 10_1C, the element isolating area 20E is surrounded by regions 10_2A, 10_2D, 10_1C, and 10_1D, and the element isolating area 20F is surrounded by regions 10_2A, 10_2D, 10_1D, and 10_1E.

The gate electrode 40_2A is provided on and across the element isolating area 30, the active area 10_2A, and the element isolating area 20A. The gate electrode 40_2A is orthogonal to the region 10_2A. The gate electrode 40_2B is provided on and across the element isolating area 20A, the active area 10_2B, and the element isolating area 20B. The gate electrode 40_2B is orthogonal to the region 10_2B. The gate electrode 40_2C is provided on and across the element isolating area 20B, the active area 10_2C, and the element isolating area 20C. The gate electrode 40_2C is orthogonal to the region 10_2C. The gate electrode 40_2D is provided on and across the element isolating area 20C, the active area 10_2D, and the element isolating area 30. The gate electrode 40_2D is orthogonal to the region 10_2D.

The gate electrode 40_1B is provided on and across the element isolating area 30, the active area 10_1B, and the element isolating area 30. The gate electrode 40_1B is parallel to region 10_1B. The gate electrode 40_1C is provided on and across the element isolating area 30, the active area 10_1C, and the element isolating area 30. The gate electrode 40_1C is parallel to region 10_1C. The gate electrode 40_1D is provided on and across the element isolating area 30, the active area 10_1D, and the element isolating area 30. The gate electrode 40_1D is parallel to region 10_1D. The gate electrode 40_1E is provided on and across the element isolating area 30, the active area 10_1E, and the element isolating area 30. The gate electrode 40_1E is parallel to region 10_1E.

Effect in Fifth Embodiment

In the fifth embodiment, the annular active area 10 is provided in a manner surrounding a plurality of element isolating areas 20A to 20C aligned in the channel length direction, and a plurality of element isolating areas 20D to 20F aligned in the channel width direction. In this manner, the fifth embodiment is capable of producing the same effects as the second and the fourth embodiments.

Sixth Embodiment

In the following, a semiconductor device according to a sixth embodiment will be explained with reference to FIG. 10 and FIG. 11.

The sixth embodiment is an application example of the first embodiment, in which the circumference of the element isolating area 30 is surrounded by an active area 70. In this manner, significant stress may be applied to both sides of regions 10_2A and 10_2B by element isolating areas 20 and 30, thereby improving the mobility of an electric charge in an MOS transistor.

The sixth embodiment is explained in detail below. In the sixth embodiment, explanations on the matters which are the same as in the first embodiment are omitted, and mainly those matters which are different are explained.

Configuration Example in Sixth Embodiment

Figure 10:
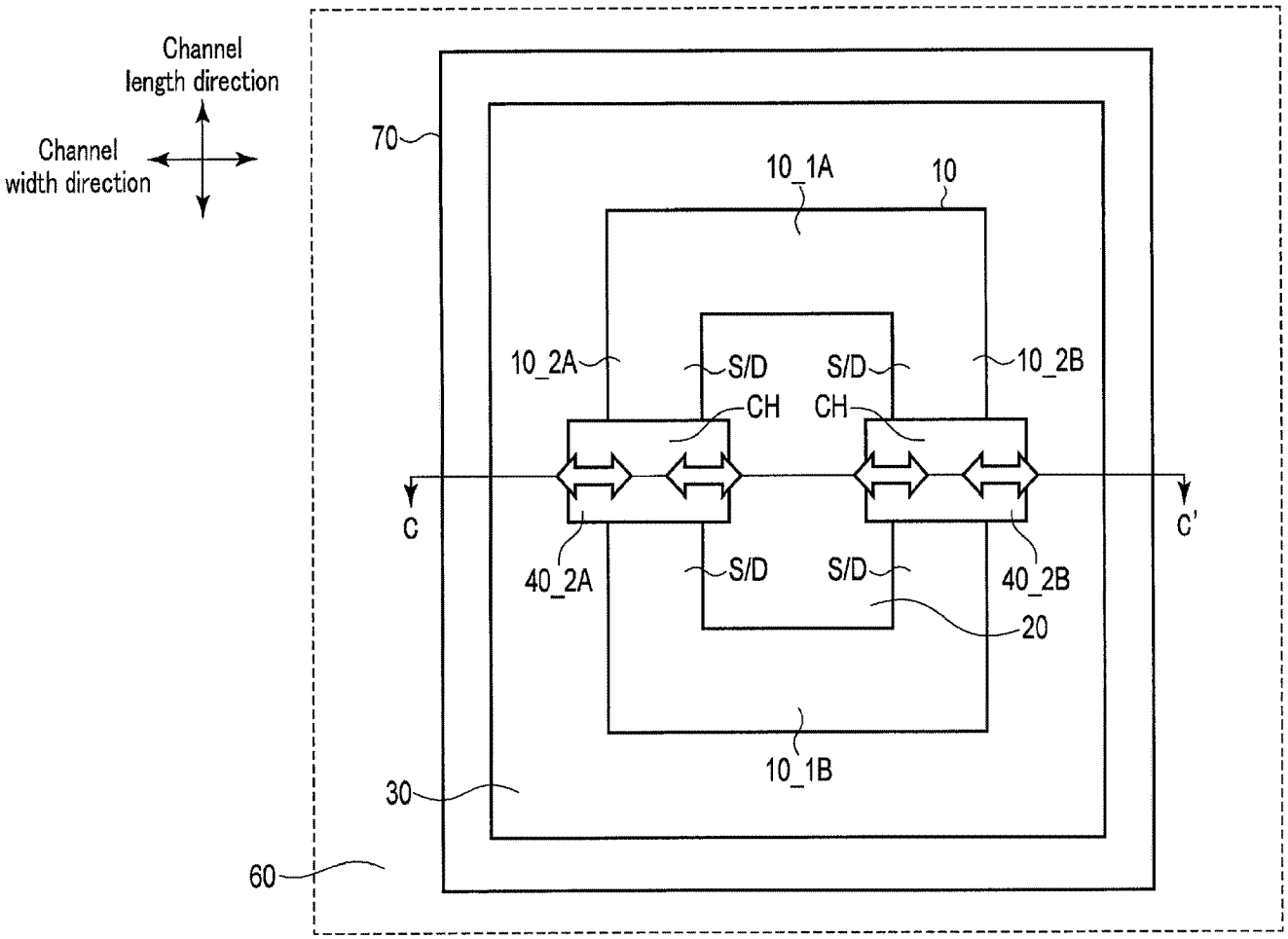
FIG. 10 is a layout diagram of a semiconductor device according to a sixth embodiment.

FIG. 10 is a layout diagram of the semiconductor device according to the sixth embodiment. FIG. 11 is a cross-sectional view taken along C-C' of FIG. 10.

Figure 11:
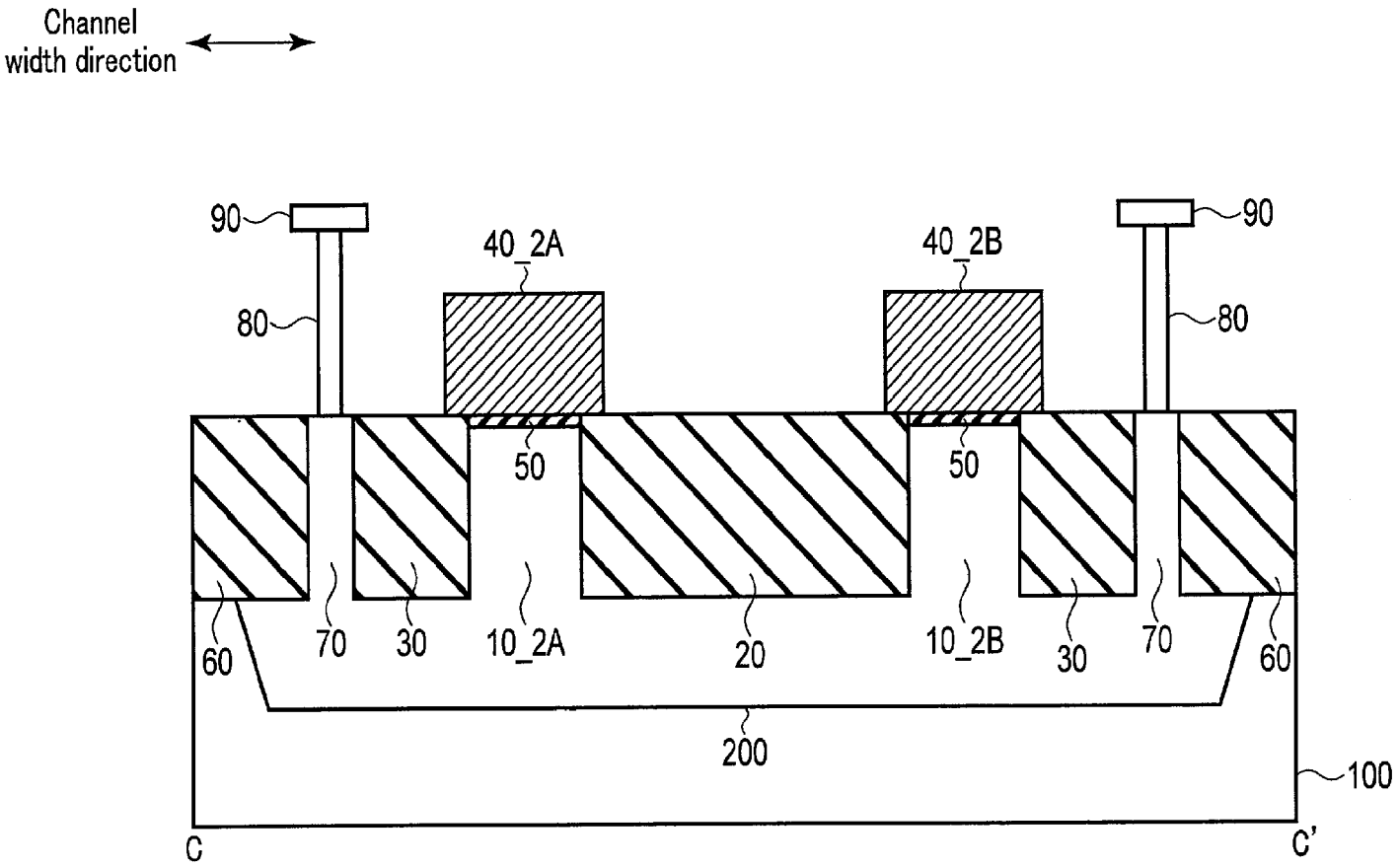
FIG. 11 is a cross-sectional view taken along C-C' of FIG. 10.

As shown in FIG. 10 and FIG. 11, the semiconductor device includes active areas 10 and 70, element isolating areas 20, 30, and 60, and a gate electrode 40 (40_2A, 40_2B).

The active area 70 is provided in a manner surrounding the element isolating area 30. The active area 70 is isolated from the active area 10. The active area 70 is electrically connected to a wiring layer 90 via a contact 80. In this manner, the active area 70 supplies substrate voltage to a well 200 from the wiring layer 90.

The element isolating area 60 is provided in a manner surrounding the active area 70. The element isolating area 60 is isolated from the element isolating area 30.

In this manner, regions 10_2A and 10_2B in the active area 10 are in contact with the element isolating area 20 at one side, and in contact with the element isolating area 30 at the other side. The circumference of the element isolating area 20 is surrounded by the active area 10, and the circumference of the element isolating area 30 is surrounded by the active area 70. Therefore, significant stress is applied to both sides of regions 10_2A and 10_2B by the element isolating areas 20 and 30.

Effect in Sixth Embodiment

In the sixth embodiment, the circumference of the element isolating area 30 is surrounded by the active area 70. In this manner, significant stress may be applied to both sides of regions 10_2A and 10_2B in the channel width direction by element isolating areas 20 and 30. Therefore, greater stress can be applied to the channel CH of the MOS transistor in the channel width direction than in the case of the first embodiment, thereby, improving the mobility of an electric charge in the MOS transistor.

In the sixth embodiment, substrate voltage is supplied to the active area 70 from the wiring layer 90 via the contact 80. In other words, by using the active area 70 as a substrate terminal, the substrate voltage can be supplied to the well 200.

Seventh Embodiment

In the following, a semiconductor device according to a seventh embodiment will be explained with reference to FIG. 12.

The seventh embodiment is an application example of the third embodiment, in which the sixth embodiment is applied to the third embodiment. In this manner, greater stress may be applied to the channel CH of the MOS transistor in the channel length direction than in the case of the third embodiment, thereby, improving the mobility of an electric charge in the MOS transistor.

The seventh embodiment is explained in detail below. In the seventh embodiment, explanations on the matters which are the same as in the third embodiment are omitted, and mainly those matters which are different are explained.

Configuration Example in Seventh Embodiment

Figure 12:
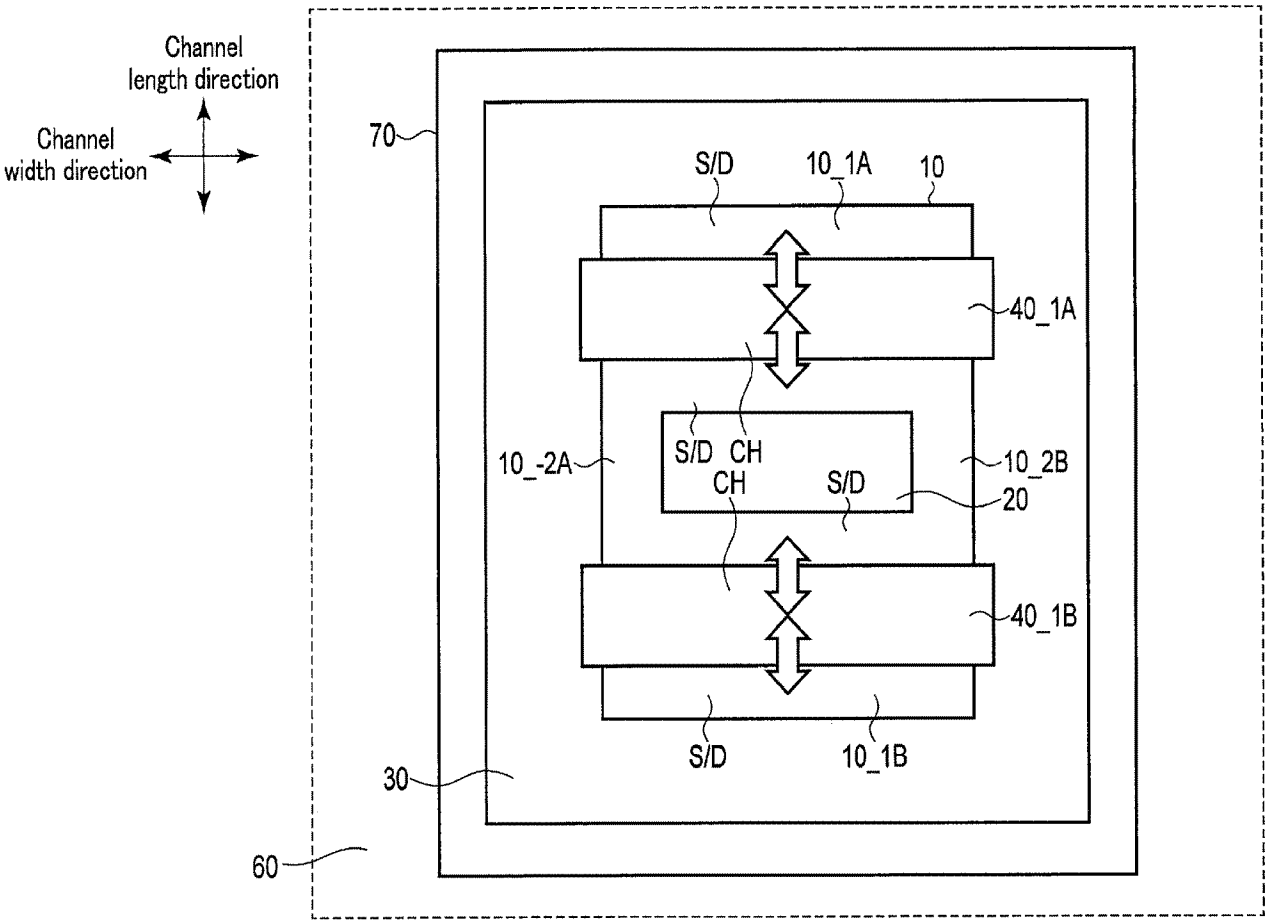
FIG. 12 is a layout diagram of a semiconductor device according to a seventh embodiment.

FIG. 12 is a layout diagram of the semiconductor device according to the seventh embodiment.

As shown in FIG. 12, the semiconductor device includes active areas 10 and 70, element isolating areas 20, 30, and 60, and a gate electrode 40 (40_1A, 40_1B).

The active area 70 is provided in a manner surrounding the element isolating area 30. The active area 70 is isolated from the active area 10. In the same manner as FIG. 11 in the sixth embodiment, the active area 70 is electrically connected electrically to a wiring layer 90 via a contact 80. In this manner, the active area 70 supplies substrate voltage to a well 200 from the wiring layer 90.

The element isolating area 60 is provided in a manner surrounding the active area 70. The element isolating area 60 is isolated from the element isolating area 30.

In this manner, regions 10_1A and 10_1B in the active area 10 are in contact with the element isolating area 20 at one side, and in contact with the element isolating area 30 at the other side. The circumference of the element isolating area 20 is surrounded by the active area 10, and the circumference of the element isolating area 30 is surrounded by the active area 70. Therefore, significant stress is applied to both sides of regions 10_1A and 10_1B by the element isolating areas 20 and 30.

Effect in Seventh Embodiment

In the seventh embodiment, the circumference of the element isolating area 30 is surrounded by the active area 70. In this manner, significant stress can be applied to both sides of regions 10_1A and 10_1B by the element isolating areas 20 and 30. Therefore, greater stress can be applied to the channel CH of the MOS transistor than in the case of the third embodiment, thereby improving the mobility of an electric charge in the MOS transistor.

Eighth Embodiment

In the following, a semiconductor device according to an eighth embodiment will be explained with reference to FIG. 13 and FIG. 14.

The eighth embodiment is an application example of the first embodiment, in which an NMOS region NM and a PMOS region PM are provided. A dimension WN of a source/drain S/D of an NMOS transistor in the NMOS region NM and a dimension WP of a source/drain S/D of a PMOS transistor in the PMOS region PM are different. This allows the effect of stress to each transistor to be adjusted.

The eighth embodiment is explained in detail below. In the eighth embodiment, explanations on the matters which are the same as in the first embodiment are omitted, and mainly those matters which are different are explained.

Configuration Example in Eighth Embodiment

Figure 13:
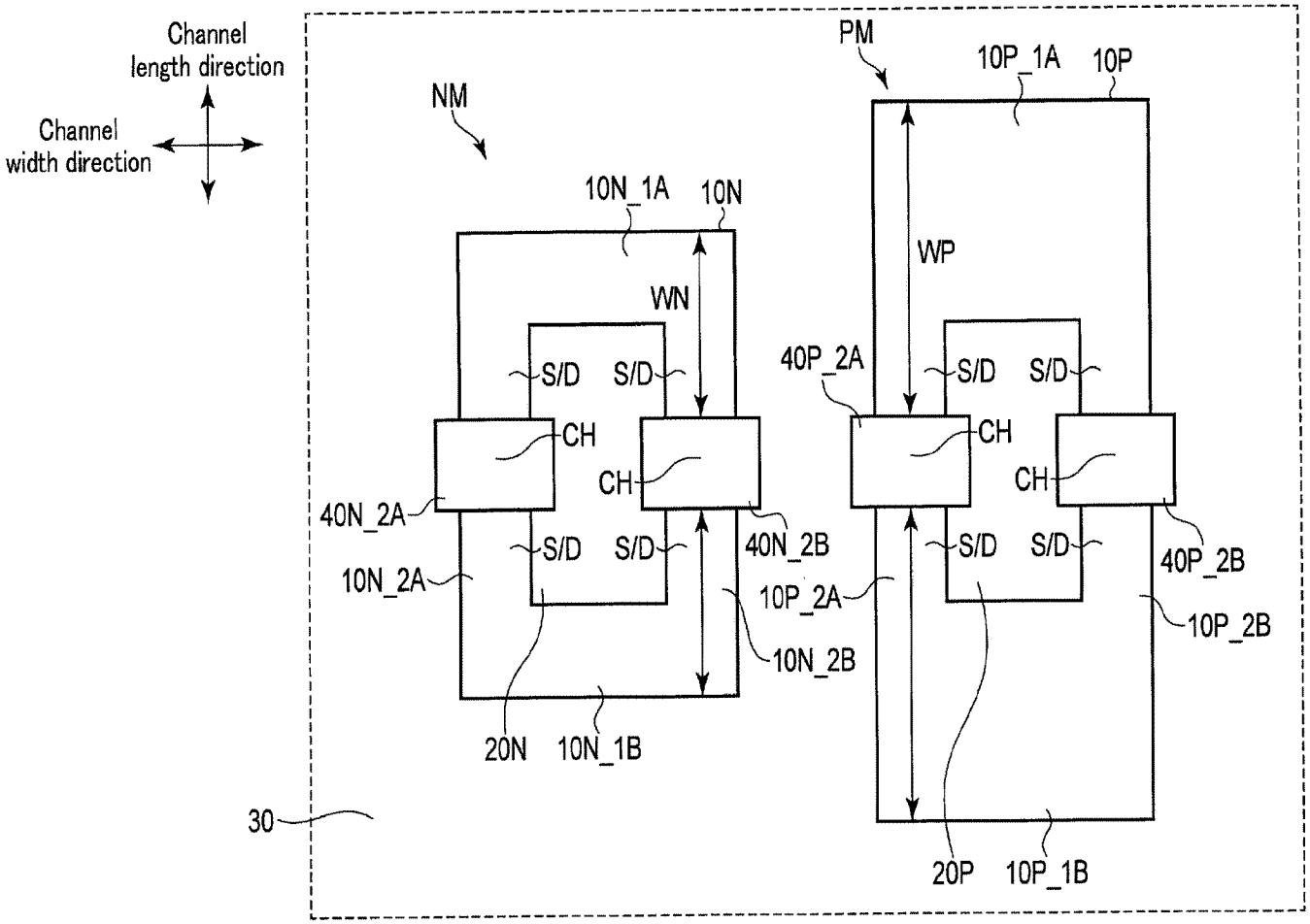
FIG. 13 is a layout diagram of a semiconductor device according to an eighth embodiment.

FIG. 13 is a layout diagram of the semiconductor device according to the eighth embodiment. FIG. 14 is a layout diagram of a modified example of the semiconductor device according to the eighth embodiment.

As shown in FIG. 13, the semiconductor device includes an NMOS region NM and a PMOS region PM.

The NMOS region NM includes an active area (element area) 10N (10N_1A, 10N_1B, 10N_2A, 10N_2B), an element isolating area 20N, and gate electrodes 40N_2A and 40N_2B. The PMOS region PM includes an active area (element area) 10P (10P_1A, 10P_1B, 10P_2A, 10P_2B), an element isolating area 20P, and gate electrodes 40P_2A and 40P_2B.

Each of the NMOS region NM and the PMOS region PM in the eighth embodiment has the same configuration as in the first embodiment. In the NMOS region NM, the active area 10N and the gate electrode 40N form the NMOS transistor, and in the PMOS region PM, the active area 10P and the gate electrode 40P form the PMOS transistor.

Here, the dimension WN of the source/drain S/D of the NMOS transistor in a channel length direction in the NMOS region NM is smaller than the dimension WP of the source/drain S/D of the PMOS transistor in a channel length direction in the PMOS region PM. In other words, the distance from the channel CH of the NMOS transistor to the element isolating area 30 in the channel length direction is shorter than the distance from the channel CH of the PMOS transistor to the element isolating area 30 in the channel length direction. Therefore, the stress applied to the channel CH of the NMOS transistor in the channel length direction is greater than the stress applied to the channel CH of the PMOS transistor in the channel length direction

Effect in Eighth Embodiment

In some cases, the stress from the element isolating area 30 to the channel CH of the MOS transistor may improve mobility, however, may also degrade mobility. Even the stress in the same direction may, in some cases, for example, improve mobility for the NMOS transistor, however, mobility for the PMOS transistor may degrade. Therefore, a case in which stress is applied only to the NMOS transistor, not to the PMOS transistor, would become necessary.

To deal with this, the eighth embodiment is provided with the NMOS region NM and the PMOS region PM. The dimension WN of the source/drain S/D of the NMOS transistor in the NMOS region NM and the dimension WP of the source/drain S/D of the PMOS transistor in the PMOS region PM are different. For example, in the case where the stress from the element isolating area 30 causes favorable effects to the NMOS transistor, however, negative effects to the PMOS transistor, the dimension WP of the source/drain S/D of the PMOS transistor is made greater than the dimension WN of the source/drain S/D of the NMOS transistor. In this manner, the effect of stress to the channel CH from the element isolating area 30 in the channel length direction is lessened for the PMOS transistor than for the NMOS transistor. In other words, the effect of stress is used only for the NMOS transistor, and is lessened for the PMOS transistor. In this manner, by adjusting the effect of stress, it is possible to provide favorable effects caused by stress to the NMOS transistor and to avoid providing negative effects caused by stress to the PMOS transistor.

In the present example, the case in which the stress from the element isolating area 30 provides favorable effects to the NMOS transistor and negative effects to the PMOS transistor has been explained. However, the case is not limited to this. For example, in the case where the stress from the element isolating area 30 causes favorable effects to the PMOS transistor and negative effects to the NMOS transistor, the dimension WP of the source/drain S/D of the PMOS transistor may be made smaller than the dimension WN of the source/drain S/D of the NMOS transistor.

Figure 14:
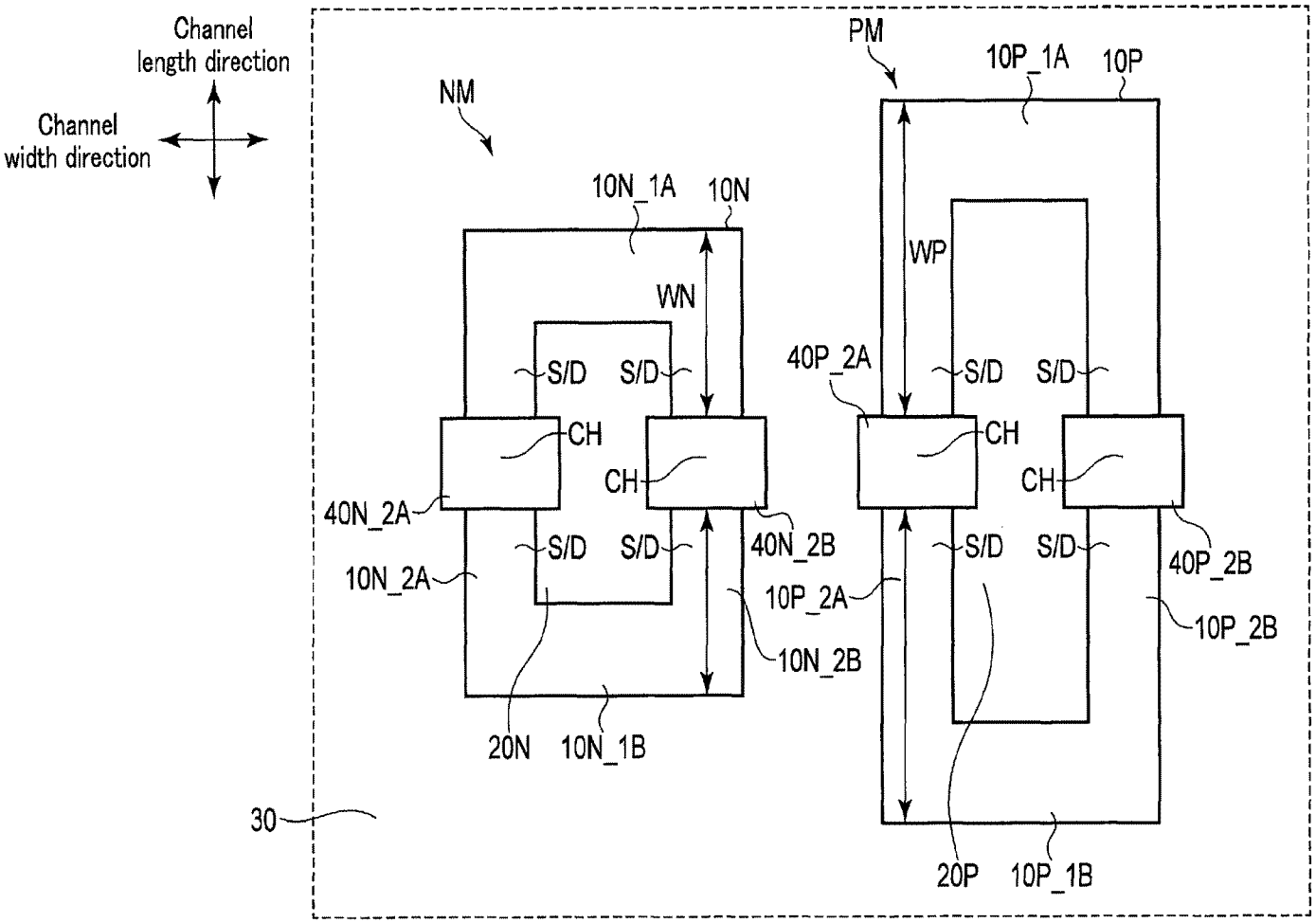
FIG. 14 is a layout diagram of a modified example of the semiconductor device according to the eighth embodiment.

As shown in FIG. 13, the dimension of an element isolating area 20P in the channel length direction in the PMOS region PM may be equivalent to the dimension of an element isolating area 20N in the channel length direction in the NMOS region NM, or may be different, as shown in FIG. 14.

Ninth Embodiment

In the following, a semiconductor device according to a ninth embodiment will be explained with reference to FIG. 15.

The ninth embodiment is an example of applying the eighth embodiment to the third embodiment.

The ninth embodiment is explained in detail below.

Configuration Example in Ninth Embodiment

Figure 15:
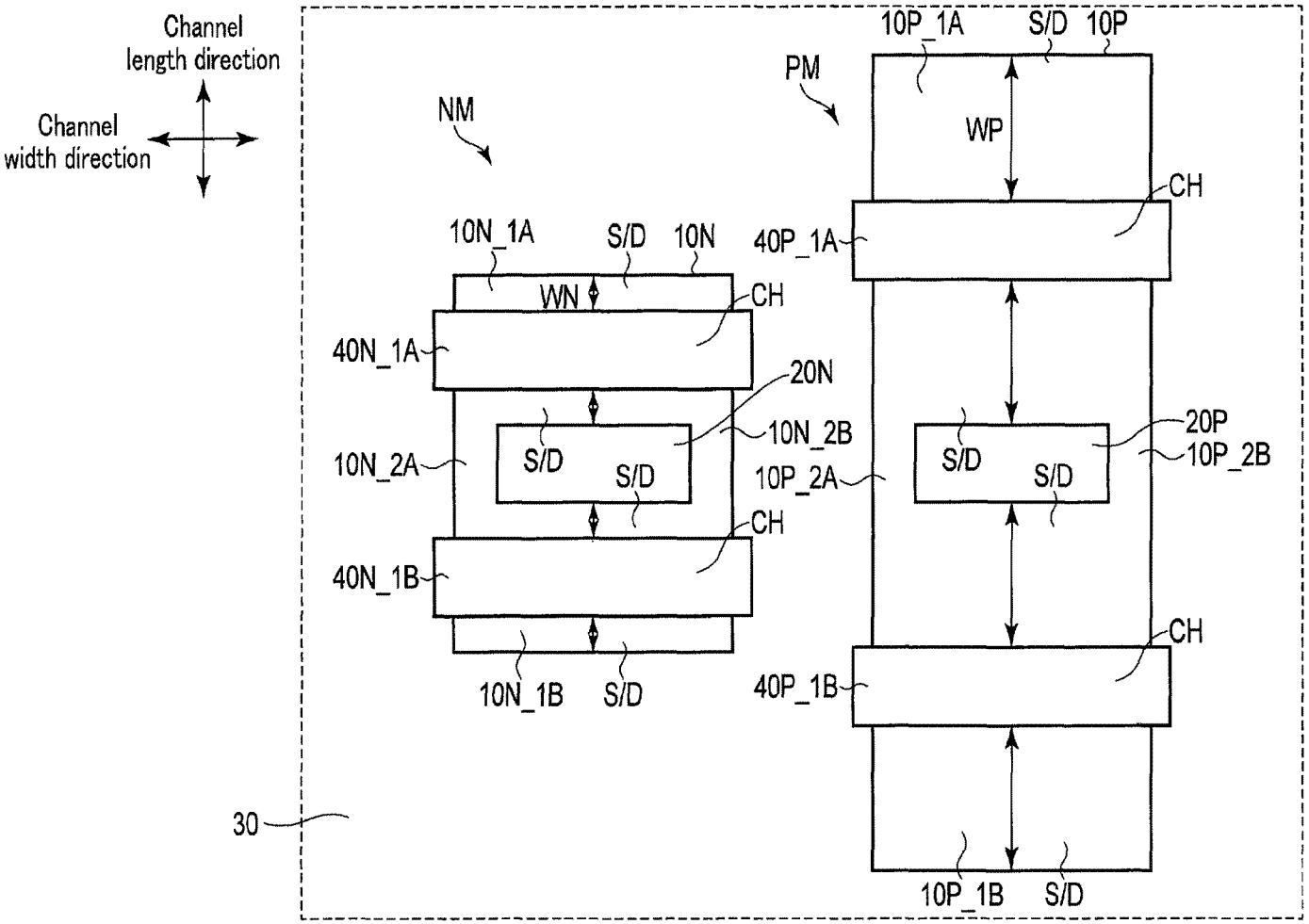
FIG. 15 is a layout diagram of a semiconductor device according to a ninth embodiment.

FIG. 15 is a layout diagram of the semiconductor device according to the ninth embodiment.

As shown in FIG. 15, the semiconductor device includes the NMOS region NM and the PMOS region PM.

The NMOS region NM includes an active area (element area) 10N (10N_1A, 10N_1B, 10N_2A, 10N_2B), an element isolating area 20N, and gate electrodes 40N_1A and 40N_1B. The PMOS region PM includes an active area (element area) 10P (10P_1A, 10P_1B, 10P_2A, 10P_2B), an element isolating area 20P, and gate electrodes 40P_1A and 40P_1B.

The NMOS region NM and the PMOS region PM in the ninth embodiment have the same configuration as in the third embodiment. In the NMOS region NM, the active area 10N and the gate electrode 40N form an NMOS transistor, and in the PMOS region PM, the active area 10P and the gate electrode 40P form a PMOS transistor.

Here, the dimension WN of the source/drain S/D of the NMOS transistor in the NMOS region NM in a channel length direction is smaller than the dimension WP of the source/drain S/D of the PMOS transistor in the PMOS region PM in a channel length direction. In other words, the distance from the channel CH of the NMOS transistor to the element isolating area 30 in the channel length direction is shorter than the distance from the channel CH of the PMOS transistor to the element isolating area 30 in the channel length direction. Therefore, the stress applied to the channel CH of the NMOS transistor in the channel length direction is greater than the stress applied to the channel CH of the PMOS transistor in the channel length direction.

Effect in Ninth Embodiment

The ninth embodiment is provided with the NMOS region NM and the PMOS region PM. The dimension WN of the source/drain S/D of the NMOS transistor in the NMOS region NM and the dimension WP of the source/drain S/D of the PMOS transistor in the PMOS region PM are different. This allows the effect of stress from the element isolating areas 20 and 30 to each transistor to be adjusted.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

[1. A semiconductor device comprising:

a first element isolating area;

a first element area surrounding all sides of the first element isolating area, and including first to fourth regions, the first and second regions extending in a first direction, the third and fourth regions extending in a second direction different from the first direction, the first region being connected to one end portion of the third region and one end portion of the fourth region, the second region being connected to the other end portion of the third region and the other end portion of the fourth region;

a second element isolating area surrounding all sides of the first element area;

a first gate electrode provided on and across the first element isolating area, the first region, and the second element isolating area;

a second gate electrode isolated from the first gate electrode and provided on and across the first element isolating area, the second region, and the second element isolating area;

a first gate insulation film provided between the first region and the first gate electrode;

a second gate insulation film provided between the second region and the second gate electrode;

a third element isolating area;

a second element area surrounding all sides of the third element isolating area, all sides of the second element area surrounded by the second element isolating area;

a third gate electrode provided on and across the third element isolating area, the second element area, and the second element isolating area; and a fourth gate electrode isolated from the third gate electrode and provided on and across the third element isolating area, the second element area, and the second element isolating area, wherein the first gate electrode and the first element area forms a first transistor, the second gate electrode and the first element area forms a second transistor, the first element area forms a rectangular annular shape, the second element area forms a rectangular annular shape, a transistor of a first conductive-type is formed by the first gate electrode and the first element area, and a transistor of a second conductive-type which is different from the first conductive-type is formed by the third gate electrode and the second element area, and the first element area and the second element area are different from each other in outer dimension in the first direction.]

[2. The device of claim 1, wherein the first gate electrode and the second gate electrode are aligned in a channel width direction.]

[3. The device of claim 1, further comprising:

a first channel region provided under the first gate electrode and in the first element area;

a first source/drain region provided in the first element area in a manner sandwiching the first channel region;

a second channel region provided under the third gate electrode and in the second element area; and a second source/drain region provided in the second element area in a manner sandwiching the second channel region, wherein a dimension of the first source/drain region is smaller than a dimension of the second source/drain region.]

[4. The device of claim 1, wherein the third region and the fourth region are provided symmetrically.]

[5. The device of claim 1, wherein a channel surface of the first and second transistor is set to (100) plane, and a channel length direction of the first and second transistor is set to <100> direction.]

[6. The device of claim 1, wherein no control gate electrode is provided above the first gate electrode and the second gate electrode.]

[7. The device of claim 1, wherein no control gate electrode is provided above a drain of the first transistor, a source of the first transistor, a drain of the second transistor and a source of the second transistor.]

[8. The device of claim 1, wherein the first direction is a channel length direction of the first and second transistors.]

[9. The device of claim 8, wherein the first element area and the second element area are equal to each other in inner dimension in the first direction.]

[10. The device of claim 8, wherein the first element area and the second element area are different from each other in inner dimension in the first direction.]

[11. The device of claim 1, wherein the first and second element areas have outer and inner dimensions designed to adjust stress from the first and second element isolating areas to the first transistor and stress from the second and third element isolating areas to the second transistor.]

*12. A semiconductor device comprising:*

*a first element isolating area made of an insulating material;*

*a first element area surrounding sides of the first element isolating area, and including first to fourth regions, the first and second regions extending in a first direction, the third and fourth regions extending in a second direction orthogonal to the first direction, the first region being connected to one end portion of the third region and one end portion of the fourth region, the second region being connected to the other end portion of the third region and the other end portion of the fourth region,*

*the first region having a first source/drain region, a first channel region and a second source/drain region arranged in this order along first direction, and*

*the second region including a third source/drain region, a second channel region and a fourth source/drain region arranged in this order along first direction;*

*a first gate electrode provided on and across the first element isolating area and the first channel region of the first region, the first gate electrode extending in the second direction and having a first end;*

*a second gate electrode isolated from the first gate electrode and provided on and across the first element isolating area and the first channel region of the second region, the second gate electrode extending in the second direction and having a second end facing the first end;*

*a first gate insulation film provided between the first region and the first gate electrode; a second gate insulation film provided between the second region and the second gate electrode;*

*a second element isolating area made of an insulating material;*

*a second element area surrounding sides of the second element isolating area;*

*a third gate electrode provided on and across the second element isolating area and the second element area; and*

*a fourth gate electrode isolated from the third gate electrode and provided on and across the second element isolating area and the second element area, wherein*

*the first gate electrode and the first element area form a first transistor,*

*the second gate electrode and the first element area form a second transistor,*

*a channel length direction of the first transistor is aligned in the first direction,*

*a channel length direction of the second transistor is aligned in the first direction,*

*the channel length directions of the first and second transistors are shifted from each other when viewed in the first direction,*

*the first element area forms a substantially rectangular annular shape,*

*the second element area forms a substantially rectangular annular shape,*

*a transistor of a first conductive-type is formed by the first gate electrode and the first element area, and a transistor of a second conductive-type which is different from the first conductive-type is formed by the third gate electrode and the second element area, and*

*the first element area and the second element area are different from each other in outer dimension in the first direction.*

*13. The device of claim 12, wherein*

*a channel surface of the first and second transistor is set to (100) plane, and*

*a channel length direction of the first and second transistor is set to <100> direction.*

*14. The device of claim 12, wherein*

*the first element area and the second element area are equal to each other in inner dimension in the first direction.*

*15. The device of claim 12, wherein*

*the first element area and the second element area are different from each other in inner dimension in the first direction.*

*16. The device of claim 12, wherein*

*the first and second element areas have outer and inner dimensions designed to adjust stress from the first element isolating area to the first transistor and stress from the second element isolating area to the second transistor.*

*17. The device of claim 12, wherein*

*when viewed in the second direction, the first and second gate electrodes are aligned with each other.*

*18. The device of claim 12, wherein*

*the second element area includes fifth to eighth regions, the fifth and sixth regions extending in the first direction, the seventh and eighth regions extending in the second direction, the fifth region being connected to one end portion of the seventh region and one end portion of the eighth region, the sixth region being connected to the other end portion of the seventh region and the other end portion of the eighth region,*

*the fifth region has a fifth source/drain region, a third channel region and a sixth source/drain region arranged in this order along first direction,*

*the sixth region includes a seventh source/drain region, a fourth channel region and an eighth source/drain region arranged in this order along first direction;*

*the third gate electrode is provided on and across the first element isolating area and the third channel region of the first region, and*

*the second gate electrode is provided on and across the first element isolating area and the fourth channel region of the second region.*

*19. The device of claim 12, wherein*

*the third gate electrode extending in the second direction and having a third end, and*

*the fourth gate electrode extending in the second direction and having a fourth end facing the third end.*

*20. The device of claim 19, wherein*

*when viewed in the second direction, the third and fourth gate electrodes are aligned with each other.*

*21. The device of claim 12, wherein*

*the transistor of the first conductive-type is formed by the first gate electrode and areas of the first region of the first element area adjacent to the first gate electrode, and*

*the transistor of the second conductive-type is formed by the third gate electrode and regions of the second element area adjacent to the third gate electrode.*

*22. The device of claim 12, wherein*

*the third gate electrode and the second element area form a third transistor,*

*the fourth gate electrode and the second element area form a fourth transistor,*

*a channel length direction of the third transistor is aligned in the first direction,*

*a channel length direction of the fourth transistor is aligned in the first direction, and*

*the channel length directions of the third and fourth transistors are shifted from each other when viewed in the first direction.*

* * * * *